United States Patent [19]

Okano et al.

[11] Patent Number: 4,529,475
[45] Date of Patent: Jul. 16, 1985

[54] DRY ETCHING APPARATUS AND METHOD USING REACTIVE GASES

[75] Inventors: Haruo Okano, Den-enchofu-honmachi; Yasuhiro Horiike, Tokyo; Makoto Sekine, Yokohama, all of Japan

[73] Assignee: Kabushiki Kaisha Toshiba, Japan

[21] Appl. No.: 613,214

[22] Filed: May 23, 1984

[30] Foreign Application Priority Data

May 31, 1983 [JP] Japan .................................. 58-94824

[51] Int. Cl.³ ...................... H01L 21/306; B44C 1/22; C03C 15/00; C23F 1/02
[52] U.S. Cl. .................................. 156/643; 118/729; 118/50.1; 118/620; 156/345; 156/646; 156/661.1; 156/662; 204/192 EC; 204/192 E; 204/298; 252/79.1; 427/38
[58] Field of Search .............. 156/345, 643, 646, 653, 156/656, 657, 659.1, 661.1, 662; 252/79.1; 118/728, 729, 730, 731, 733, 50.1, 620; 427/38, 39; 204/192 EC, 192 E, 298

[56] References Cited

U.S. PATENT DOCUMENTS 4,183,780  1/1980  McKenna et al. .................. 156/643
4,260,649  4/1981  Dension et al. ................. 156/635 X

FOREIGN PATENT DOCUMENTS 57-13177  1/1982  Japan ................................ 156/643

Primary Examiner—William A. Powell
Attorney, Agent, or Firm—Banner, Birch, McKie & Beckett

[57] ABSTRACT

A dry etching apparatus is disclosed which uses reactive gases and which is capable of achieving anisotropic etching without causing radiation damage to a workpiece to be selectively etched. The workpiece is placed in a vacuum container into which two feedstock gases are introduced. One of the gases contributes to the etching, while the other forms a film on the side wall of the etched portion of the workpiece, the film protecting it against lateral etching. A first beam which dissociates the first feedstock gas is perpendicularly directed toward the workpiece, whereas a second gas which dissociates the second feedstock gas is directed in the general direction of the workpiece.

36 Claims, 8 Drawing Figures

DRY ETCHING APPARATUS AND METHOD USING REACTIVE GASES

BACKGROUND OF THE INVENTION

The present invention relates to a dry etching apparatus and method using a reactive gases.

In order to fabricate very large-scale integrated, circuits, it is necessary to etch films of silicon, silicon nitride, tungsten, aluminum, etc. Parallel-plate plasma type etching apparatus are now widely used for this purpose. This plasma etching apparatus includes a vacuum container containing the workpiece and an anode electrode positioned opposite to a cathode electrode. A glow discharge plasma is produced upon introducing a feedstock gas into the container and applying radiofrequency energy between the anode and the cathode to generate reactive ions for the etching process. Positive ions in the plasma are accelerated by the cathode, which thereby bombard the workpiece. Thus, the workpiece is etched by the accelerated ions. When the material to be etched is, for example, polyersystalline silicon doped with phosphorus, it is possible to use chlorine as the feedstock gas. According to C. J. Mogab and H. J. Levinstein; "Journal of Vacuum Science Technology," pp. 721, 1980, anisotropic etching can be effectively performed by introducing $C_2F_6$, for example, as an additive gas into the plasma vacuum container. In this case, a recombination action occurs of Cl radicals, resulting from dissociation of the introduced chlorine gas, and $CF_3$ radicals resulting from dissociation of the $C_2F_6$ additive gas. Lateral etching of the side walls of the etched portion of the workpiece is prevented to some extent. However, this system does not permit optimizing, selecting and accurate control of both etching and anisotropy.

Moreover, this etching apparatus has several disadvantages. Since the workpiece to be etched is exposed to plasma, the workpiece undergoes various types of radiation damage. One form of radiation damage is caused by charged particles such as ions and electrons which electrify the workpiece. Because of this electrification when fabricating transistors, a thin oxide film is formed on the workpiece; the film is subjected to dielectric breakdown or traps are created in it. Another form of radiation damage is caused by soft x-rays which produce a shift in threshold value of the formed transistors. Another form of radiation damage is caused by positive ions in the plasma which are attracted toward the grounded evacuated container. These ions bombard and spatter the metal wall of the container, resulting in contamination of its interior.

In view of these problems an improved apparatus is disclosed in H. Akiya; "Proceedings of the third Symposium on Dry Processes," pp. 119, 1981. In that apparatus, neutral fluorine radicals having a kinetic energy equivalent to the plasma temperature are extracted from the plasma and directed onto the workpiece to effect etching. Another improved apparatus is disclosed in H. Okano et al.; "Proceedings of the Fourth Symposium on Dry Processes," pp. 6–10, 1982. In that apparatus, an excited gas, such as $Cl_2$ gas, is introduced into an evacuated container containing the workpiece; the workpiece is then illuminated with ultraviolet rays to cause a photochemical reaction to produce the etching action.

When a workpiece was selectively etched using these apparatuses, any aforementioned radiation damage was not observed. Rather, so-called side (or lateral) etching occurred and not the desired anisotropic etching. Side etching causes non-uniform characteristics in the resulting product. This is illustrated in FIG. 1. Shown is a workpiece 1 containing a silicon substrate 2 with an oxide film 3 formed thereon. A phosphorus doped polycrystalline silicon film 4 is formed on film 3 which will be etched as shown by the broken line. Silicon film 4 is coated with a resist film 5. Workpiece 1 is exposed to the feedstock gas (e.g. chlorine) and is then illuminated with ultraviolet rays. As a result, activated chlorine is produced for etching the workpiece 1 in a vertical direction as well as in a lateral direction. As shown, the side wall of silicon film 4 is etched off to form the undesirable shape indicated by numeral 7. Consequently, the desired mask configuration is not maintained and non-uniform circuit characteristics are produced.

SUMMARY OF THE INVENTION

Accordingly, it is an object of the present invention to provide a drying etching apparatus using reactive gases which are capable of substantially limiting lateral etching and thereby achieving an anisotropically etched workpiece.

Another object of the invention is to prevent radiation damage of the workpiece to be etched.

It is another object of the invention to provide a dry etching apparatus suitable for fabricating very high density integrated circuits.

It is a further object of the invention to provide an etching system and method with selective etching and anisotropy.

It is still further another object of the invention to provide a dry etching apparatus which can control selective etching and anisotrophy using two independent beams.

These objects are achieved in accordance with the invention by a dry etching apparatus utilizing reactive gases and comprises: an evacuated container in which the workpiece is placed; a first gas supply source for providing a first feedstock gas for use in etching the workpiece; a first beam source for generating and directing a first beam toward the workpiece for exciting the first gas to etch selected portions of the workpiece; a second gas supply source for providing a second feedstock gas for substantially limiting lateral etching of the workpiece; and a second beam source for generating and directing a second beam from a different direction, toward the general direction of the workpiece for exciting the second gas to substantially limit lateral etching of the workpiece.

According to the invention, the workpiece is preferably neither exposed to a plasma nor an electric field as in a parallel-plate etching system; thus less radiation damage occurs and processing can proceed at a lower temperature. The invention also enables selective control of anisotropy and vertical etching, since a second beam is used to contribute to the anisotropy of the etching; in addition a second gas can be used with the first gas. While in one embodiment of the invention a plasma is utilized, an additional beam is utilized to limit the adverse effects caused by the plasma.

Anisotropic etching in accordance with the invention is produced by three reactions: First, either the second excited and dissociated feedstock gas or the product produced by the reaction of the second gas with the first excited gas is deposited on the side wall of the etched portion of the workpiece to form a film for protecting the workpiece against lateral etching. Secondly, the dissociated second gas reacts with the surface of the etched side wall of the workpiece to form a film for protecting the workpiece against etching. Thirdly, the dissociated first gas recombines with the dissociated second gas to thereby suppress the lateral etching of the side wall which would otherwise be produced by the first gas.

According to the invention, selective control of vertical and anisotropic etching is performed by using two beams directed from different directions. Two gases can be utilized or, if desired, a single gas. The selective etching and its anisotropy can therefore be optimized by selecting and controlling gases and independent beams.

In some embodiments of the invention, two light rays of different center wavelengths are adopted as the aforementioned beams, and the gases are dissociated by photochemical reacton caused by the two respective beams.

In other embodiments of the invention, one of the beams is directed perpendicular to the workpiece, while the other beam is directed parallel to the etching surface of the workpiece. This configuration is especially preferable in the case where a etching mask is spaced between the workpiece and the first beam source. With that arrangement, the second beam can effectively enter the region between the etching and the workpiece and, thereby, contribute to the anisotropy. The first and second beams can be light rays, x-rays, other electromagnetic radiations, neutral radical beams, etc., or a combination thereof.

DETAILED DESCRIPTION OF THE PREFERRED EMBODIMENTS

Figure 1:
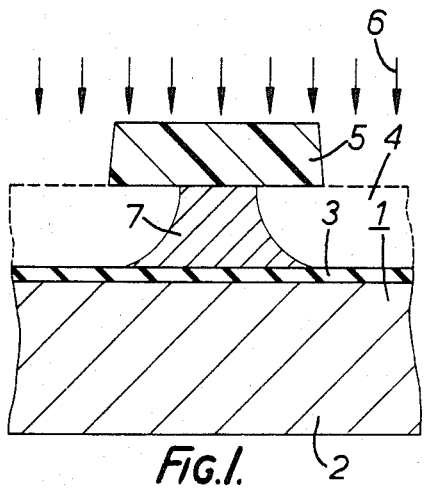
FIG. 1 is a cross-sectional view of a workpiece etched by a conventional apparatus.
Figure 2:
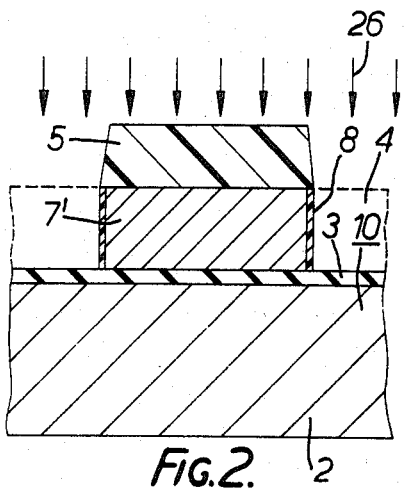
FIG. 2 is a cross-sectional view of a workpiece utilizing a dry etching apparatus according to the invention.
Figure 3:
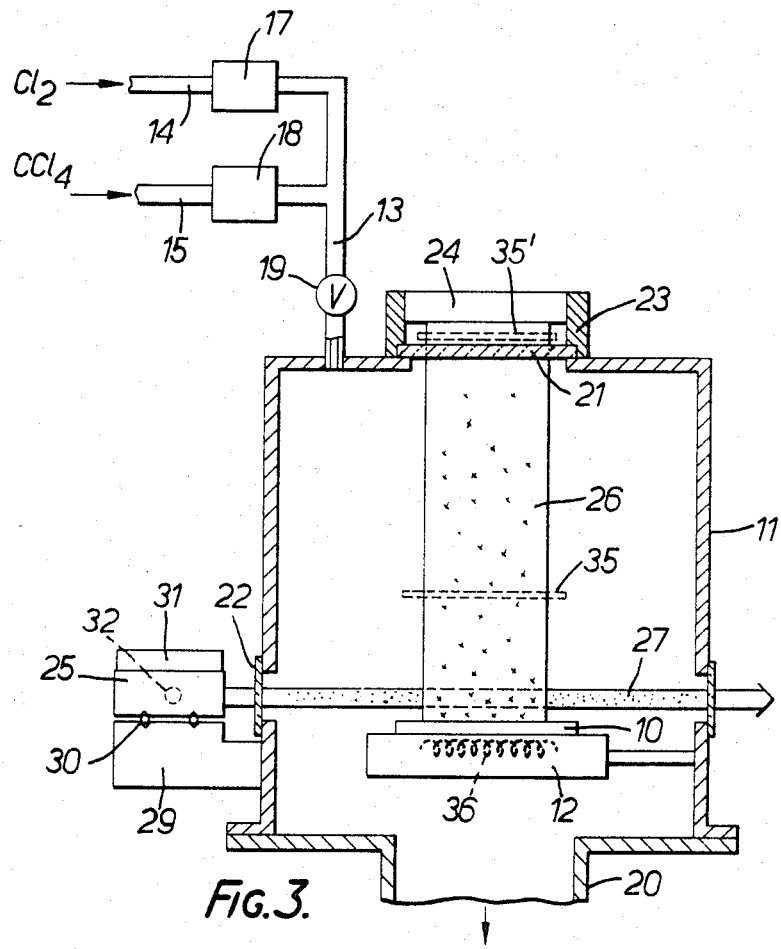
FIG. 3 is a schematic and structural view, partially in section, of the dry etching apparatus according to a first embodiment of the invention.
Figure 4:
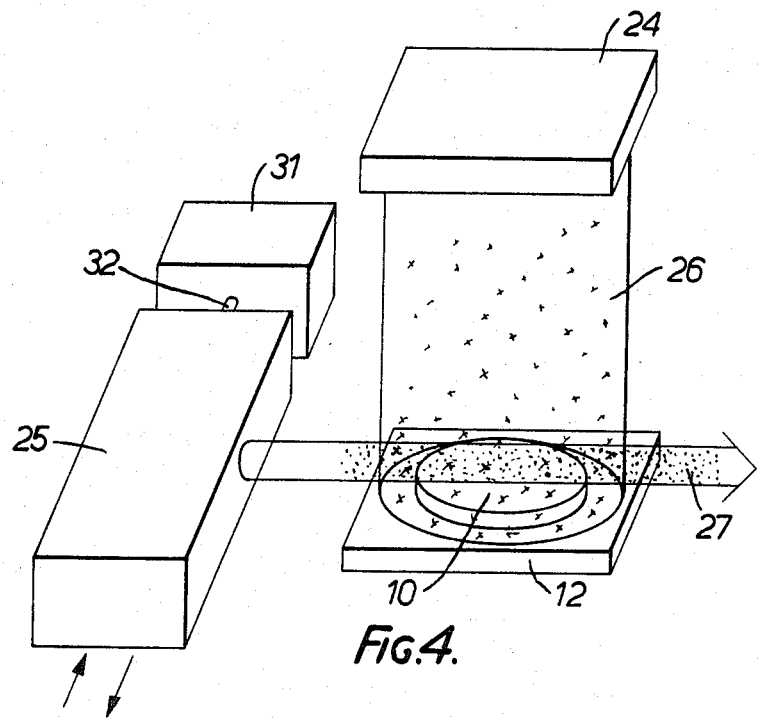
FIG. 4 is a perspective view of the main components of the apparatus shown in FIG. 3.

Referring to FIGS. 3 and 4, the construction of the dry etching apparatus according to a first embodiment of the present invention will be explained. The apparatus comprises a stainless steel container 11 which contains a stainless steel stage 12 secured to the container. A workpiece 10 is mounted on stage 12. As shown in FIG. 2, workpiece 10 has a p-type silicon substrate 2 on which a $SiO_2$ film 3 is formed. A polycrystalline silicon film 4 doped with phosphorus is formed on film 3 as indicated by the broken lines. Film 4 is then covered with a resist pattern 5.

A gas inlet pipe 13, receiving gas supplied from gas supply pipes 15 and 14, is secured to container 11. A $Cl_2$ gas which serves as a first feedstock gas for etching workpiece 10 is supplied through pipe 14, while a $CCl_4$ gas which serves as a second feedstock gas for use in substantially limiting lateral etching is fed through pipe 15. The flow rates of the supplied gases are controlled by conventional flow rate control systems 17 and 18 respectively. The gases are mixed in pipe 13, and the flow rate of the resultant mixed gas is accurately controlled by a needle valve 19.

An exhaust pipe 20, secured to container 11, is connected to an evacuating equipment (not shown) for evacuating the interior of container 11 to approximately $10^{-6}$ torr. The top wall and left wall of container 11 are provided with windows 21 and 22, respectively, of silica glass for transmitting ultraviolet rays. A Cd-Hg laser 24 acting as the first beam source is supported by a support member 23 fixed to the top wall of container 11. A light beam 26 (e.g., first beam), emitted by light source 24, has a circular cross section. Beam 26 penetrates window 21 and is perpendicularly directed onto the entire upper etching surface of workpiece 10. A support 29 is fixed to the left wall of container 11. A $CO_2$ laser 25 acting as the second beam source is supported on support 29 via ball bearings 30. Light source 25 is coupled via a driving shaft 32 to a conventional driving mechanism 31 for reciprocating source 25 in the direction indicated in FIG. 4. A light beam 27 (e.g., second beam), emitted by source 25, has a circular cross section and forms a thin and narrow light beam. Beam 27 passes through window 22 and is directed in the general direction of the workpiece. As shown in FIG. 4, beam 27 is directed in parallel and slightly above the workpiece. Since light source 25 is reciprocated, beam 27 scans the entire area of workpiece 10. It should be understood that beam 27 can be directed onto the workpiece at any angle, rather than above it. While it is preferable for beam 27 to intersect at least a portion of beam 26, it is not necessary. Light beams 26 and 27 have, for example, center wavelengths of 325 nm and 1 um, respectively. The flow rates of the $Cl_2$ gas and the $CCl_4$ gas supplied along inlet pipe 13 are, for example, 20 ml/min. The atmosphere in container 11 is controlled to a pressure of 100 torr.

Within container 11, the $Cl_2$ gas effectively absorbs photons of energy from beam 26; the wavelength of beam 26 is approximately 325 nm. Accordingly, the gas is dissociated to produce an activated chlorine gas, which is used as an etchant for the polycrystalline silicon. The $CCl_4$ gas is dissociated by a multiple photon process caused by light beam 26, resulting in $CCl_2$, for example. The $Cl_2$ gas, however, is not dissociated by beam 26. When the activated radicals of these gases meet, unsaturated molecules such as $C_2Cl_4$ are produced. These unsaturated molecules are deposited on the side wall of polycrystalline silicon film 7' of the workpiece 10 which was etched by the photochemical reaction. As a result, a film 8 is formed which sutstantially protects silicon film 7' against further etching, as shown in FIG. 2. However, the upper surface of film 7, illuminated by light beam 26, is vertically etched. The reaction of first beam 26 and the first gas produces reactive chlorine and causes the etching of film 7. Thus etching process occurs only if it is superior to the deposition process of the unsaturated molecules caused by beam 27 and the second gas. By selectively controlling the wavelength of beam 27 and the particular second gas used with respect to the wavelength of beam 26 and the particular first gas used, silicon film 7' can be selectively and anisotropically etched without causing undercut of layer 3. Therefore, the etching selectivity of silicon film 7' is very large.

In the above example, the wavelength ranges of beams 26 and 27 differ from each other. Therefore, beams 26 and 27 can independently activate the $Cl_2$ and $CCl_4$ gases, respectively. Thus, the control of etching by the $Cl_2$ gas and the control of anisotropy by the $CCl_4$ gas can be facilitated and optimized. Even if the center wavelengths of the beams are identical or substantially identical, the independent control of etching and anisotropy can be maintained. Further, since the beams 26 and 27 are directed from different directions, light sources 24 and 25 can be easily secured. Even if an apparatus design is selected whereby an etching mask 35 or 35' (FIG. 3) for selectively transmitting the light is disposed between workpiece 10 and light source 24, instead of a resist pattern 5 (FIG. 2), the process of the instant invention can be effectively performed. This is effective since the two light beams 26, 27 are directed from different directions.

Any beam of energy which dissolves the unsaturated molecules deposited on the workpiece 10 into volatile substances can be used as beam 26. For example, $Cl_2$ and $H_2$ (or its compound) can be supplied into the container via gas supply pipes 14 and 15, respectively. Workpiece 10 is vertically illuminated with an ultraviolet ray having a center wavelength of 325 nm for dissociating $Cl_2$. Workpiece 10 is also vertically illuminated with an infrared ray having a center wavelength of 2.5 um for dissociating HCl. Further, a laser beam for dissociating $H_2$ (or its compound) is directed toward the workpiece and in parallel thereto. As a result, HCl which is formed on the workpiece 10 is easily dissociated by the 2.5 um infrared ray and, the etching proceeds vertically. The HCl which adheres to the etched side wall of polycrystalline silicon film 7' forms a film for protecting it from the etching action of the activated chlorine. Suitable light sources 24 for activating chlorine are, for example, a XeCl excimer laser having a center wavelength of 308 nm, a $N_2$ excimer laser having a center wavelength of 337 nm, and a XeF excimer laser having a center wavelength of 350 nm.

It is also possible to use $Si(CH_3)_4$ as the second feedstock gas. In that case, suitable light sources for source 25 are an $F_2$ excimer laser having a center wavelength of 157 nm and an ArF excimer laser having a center wavelength of 193 nm. In this case, if mercury vapor is introduced into container 11 and a light beam having a wavelength of 253.7 Å is used, the sensitization action of the mercury facilitates decomposition of $Si(CH_3)_4$. In addition, if $B_2H_6$ containing boron effecting a P conductivity type is added to the $Si(CH_3)_4$, the resistance of the protective film against etching is improved.

Various gases, known in the reactive ion etching field, can be used as the first feedstock gas. For example, halogen element gases including the above-described chlorine gas and gaseous halides can be used as the first gas. Various gases can be used as the second feedstock gas. For example, it is possible to use compound gases containing carbon and halogen, hydrocarbon gases, $SiH_4$, $SiCl_4$, $SiF_4$, other silicon compound gases, $WF_6$, $WCl_6$, $Al(CH_3)_3$, $W(CO)_6$, $Mo(CO)_6$, other compound gases, or oxygen. If oxygen is used, the etched side wall of silicon film 7' is oxidized to form a layer that protects film 7' against further etching action.

A high melting point metal such as molybdenum or tungsten, or a silicide of such metal, as well as the aforementioned polycrystalline silicon 4 can be used as the film 4 to be etched. In that case, chlorine gas can be used as the first feedstock gas, and $W(CO)_6$ or $Mo(CO)_6$ can be used as the second feedstock gas. If, however, aluminum or an aluminum compound is used as film 4, then chlorine gas and chloroform ($CH_3Cl$) can be employed as the first and second gases, respectively. If aluminum or its compound is used, it will be required to utilize a heater 36 within stage 12 for heating the workpiece 10 to approximately 200° C. to sublimate a reaction product (i.e., aluminum chloride). If the film to be etched consists of $SiO_2$, then $CF_4$ and $W(CH_3)_4$ can be utilized as the first and second feedstock gases, respectively.

Figure 5:
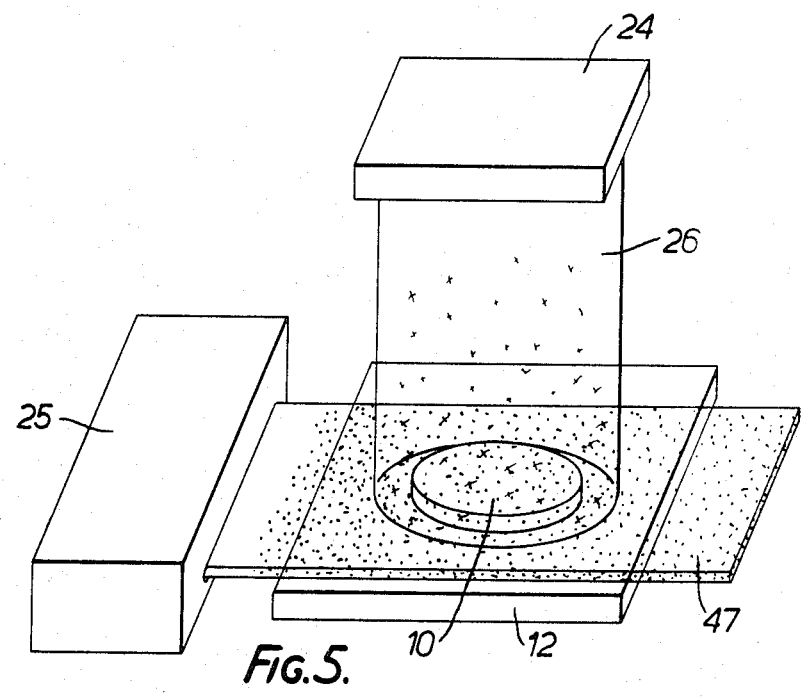
FIG. 5 is a perspective view of the main components of the apparatus according to a second embodiment of the invention.

FIG. 5 shows another embodiment of the invention. It is to be noted that the same components identified in FIGS. 3 and 4 are used in this embodiment and the other embodiments. The dry etching apparatus of FIG. 5 is characterized in that the second light beam 47, emitted by laser source 25, has a rectangular cross section which extends above the entire etching surface of workpiece 10. This embodiment dispenses with the driving mechanism 25, utilized in the embodiment shown in FIGS. 3 and 4. The embodiment of FIG. 5 enjoys the advantage of high etching uniformity.

Figure 6:
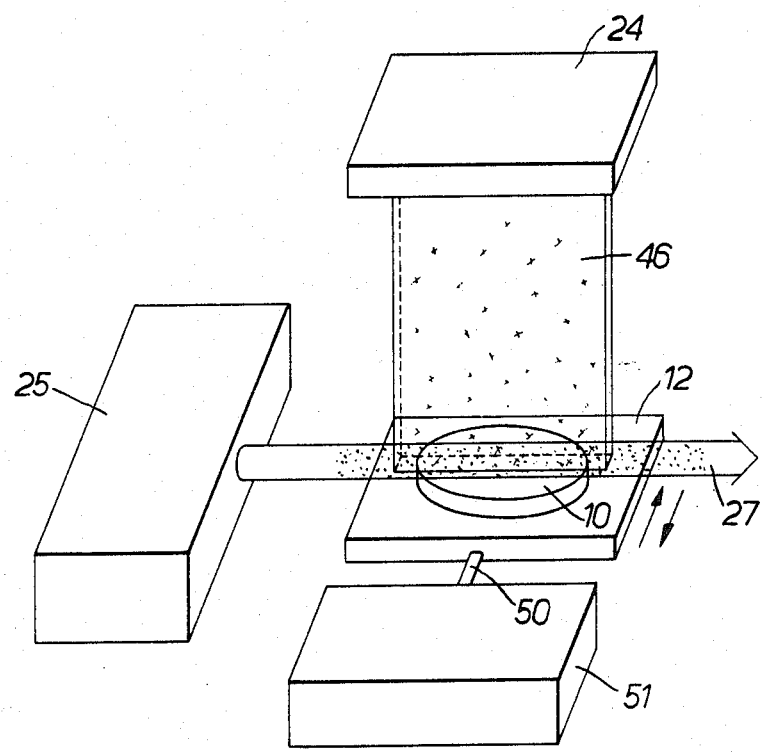
FIG. 6 is a perspective view of the main components of the apparatus according to a third embodiment of the invention.

The embodiment of FIG. 6 is characterized in that first light beam 46 has a rectangular cross section and intersects the light beam 27 emitted from laser source 25. In this case, stage 12 is reciprocally moved by a driving mechanism 51 connected to a drive shaft 50; movement of stage 12 causes scanning of light beam 46 over workpiece 10.

Figure 7:
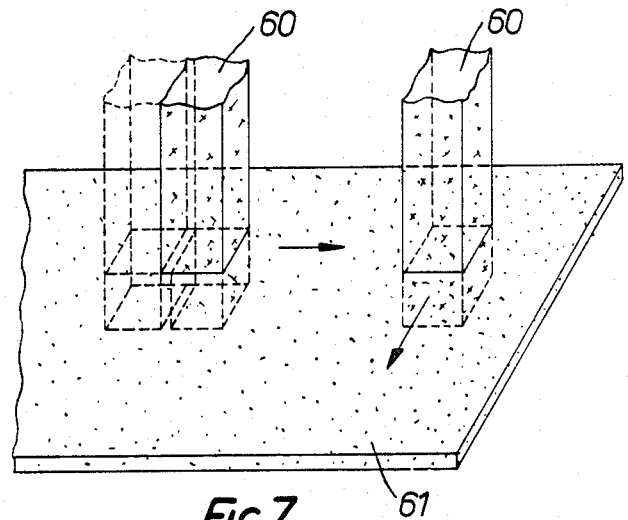
FIG. 7 is a view showing the relationship between the two beams in the apparatus according to a fourth embodiment of the invention.

FIG. 7 shows a further embodiment wherein the invention is applied to a step-and-repeat type etching process. The first light beam 60, contributing to the etching process, is a relatively thin beam having a rectangular cross section. The second light beam 61, perpendicular to beam 60 and contributing to the anisotropy, has a rectangular cross section and extends over the entire workpiece (not shown). Etchant regions are formed on the workpiece in a stepwise manner by moving either beam 60 or workpiece 10 in the X and Y directions.

Figure 8:
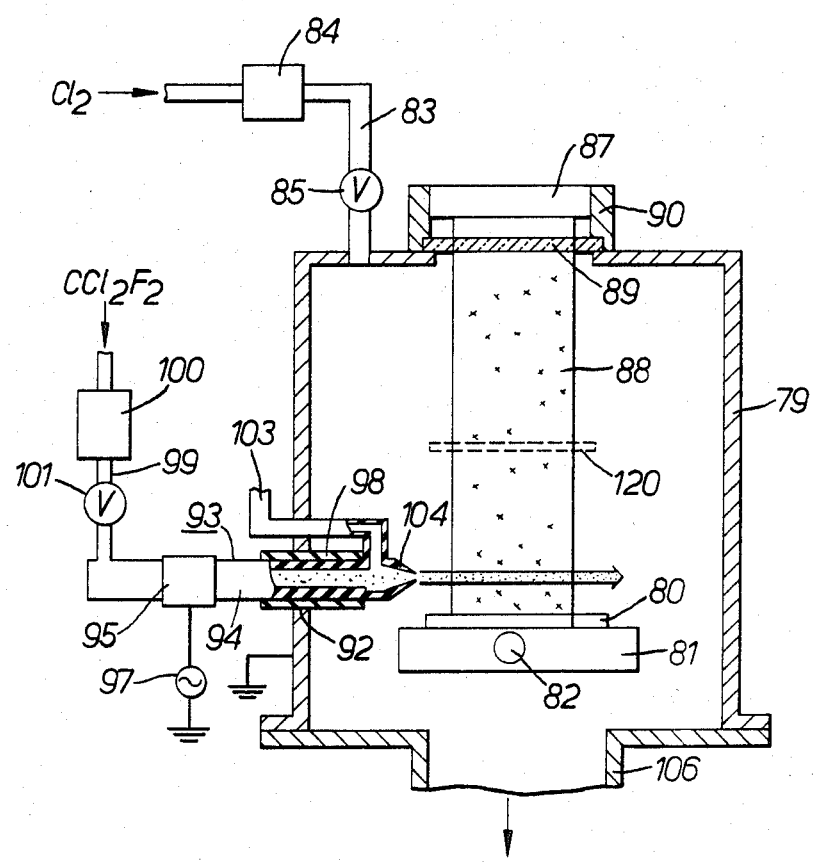
FIG. 8 is a schematic and structural view, partially in section, of the apparatus according to a fifth embodiment of the invention.

FIG. 8 schematically shows the construction of a dry etching apparatus according to a still another embodiment of the invention. This apparatus includes a stainless steel container 79. A workpiece 80 having a polycrystalline silicon film covered with a resist pattern is disposed in container 79. Workpiece 80 is positioned on a stainless steel stage 81 which is connected to a drive shaft 82. A driving mechanism (not shown) installed outside container 79 reciprocally moves stage 81 via shaft 82. A gas inlet pipe 83 is connected to container 79 for introducing the first feedstock gas (e.g., chlorine gas). The flow rate of the chlorine gas is controlled by a flow rate control system 84, and is further controlled to 20 ml/min by a needle valve 85. A laser light source 87 serving as the first beam source is supported by a support member 90 attached to the top wall of container 79. Light source 87 radiates a first light beam 88 having a rectangular cross section. Beam 88 is perpendicularly directed onto workpiece 80 through a light transmitting window 89. The left wall of container 79 is provided with a hole 92 in which an electric discharge device 93 is fixedly secured. Discharge device 93 comprises a discharge tube 94 of alumina having an annular electrode 95 surrounding tube 94. A 13.56 MHz high-frequency power source 97 is connected to electrode 95. An insulating member 98 is interposed between hole 92 and discharge tube 94. Tube 94 is connected to a gas inlet pipe 99. The second feedstock gas (e.g., $CCl_2F_2$), is introduced into pipe 99, and its flow rate is controlled to 50 ml/min by both a flow rate control system 100 and a needle valve 101. The pressure of the gas within the discharge tube 94 is set, for example, to 1 torr. For controlling the internal pressure, a bypass discharge pipe 103 is connected to discharge tube 94. The front end 104 of discharge type 94 forms a nozzle, through which neutral radicals, produced in the discharge tube, can be blown off.

The ions in the plasma are immediately annihilated and are blown off in the general direction of the workpiece. Container 79 is connected to an exhaust pipe 106, which, in turn, is connected to evacuating equipment (not shown) for maintaining the inside of container 79 at a pressure of $10^{-2}$ torr. The gas blown off from nozzle 104 is given a kinetic energy in the form of a jet of gas (i.e., a second beam) and is directed in parallel to the surface of the workpiece. The polycrystalline silicon film is etched by the chlorine dissociated by first beam 88. $CCl_2$ or $C_2Cl_4$ produced by discharge device 93 adheres to the etched side wall of the polycrystalline silicon film to form a protective film for protecting the silicon film against further etching action. While a plasma is utilized in this embodiment, the use of the additional beam minimizes the effects observed in the prior art plasma devices.

In the embodiment of FIG. 8, laser light source 87 can be replaced by a device similar to the electric discharge device 93 to blow and direct the dissociated chlorine perpendicularly onto the surface of workpiece 80 for producing the etching action. In that case, gas inlet pipe 83 would be dispensed with. It is also possible to use a device for blowing off a gas dissociated and activated by light illumination, instead of source 87 or electric discharge device 93. Furthermore, the resist pattern placed on workpiece 80 can be replaced by a mask 120, spaced from the workpiece, for selectively transmitting light.

Several of the above embodiments show a single, first source for producing a first beam for use in etching, and a single, second source for producing a second beam for anisotropy. It should be understood, however, that at least one of these sources can comprise a plurality of beam generating sources or a multi-photon source.

In addition, the first beam may serve to excite a surface of the workpiece for etching, and at the same time the second beam may contribute to supplying reactive radicals for both etching as well as anisotropy, without the need for two gases. In this case, $CClF_3$ gas is used, while an argon fluoride laser (193 MM) is used for the first beam and a $CO_2$ laser (10.4 micro-meter) is used for tthe second beam. The second beam dissociates $CClF_3$ into $Cl$ and $CF_3$. The first beam excites a surface of the workpiece. The Cl radicals contributes to etching and the recombination of Cl and $CF_3$ contributes to the prevention of side etching.

We claim:

1. A dry etching apparatus for producing a substantially anisotropically etched workpiece comprising:
   a container in which said workpiece is placed,
   an evacuating means for evacuating the container,
   a first gas supply means for providing a first feedstock gas for use in etching said workpiece,
   a first beam generating means for generating and directing a first beam toward the workpiece for exciting said first feedstock gas to etch selected portions of said workpiece,
   a second gas supply means for providing a second feedstock gas for use in substantially limiting lateral etching of the workpiece, and
   second beam generating means for generating and directing a second beam in the general directin of the workpiece for exciting said second feedstock gas to substantially limit lateral etching of the workpiece.

2. A dry etching apparatus according to claim 1, wherein at least one of the first and second beam generating means is a light source.

3. A dry etching apparatus according to claim 2, wherein said beam generating means emits a laser beam.

4. A dry etching apparatus according to claim 1, wherein at least one of the first and second beams dissociates at least one of the first and second feedstock gases.

5. A dry etching apparatus according to claim 1, wherein the first beam impinges the workpiece in a direction substantially perpendicular to the etching surface of the workpiece, and wherein the second beam is directed toward the workpiece in a direction substantially parallel to the etching surface.

6. A dry etching apparatus according to claim 1, wherein at least one of said beams is scanned over the workpiece.

7. A dry etching apparatus according to claim 1, further comprising means for reciprocating the workpiece so that at least one of said beams is scanned over the workpiece.

8. A dry etching apparatus according to claim 1, wherein at least one of the first and second beams has a rectangular cross section.

9. A dry etching apparatus according to claim 1, wherein the first beam impinges onto the entire etching surface of the workpiece.

10. A dry etching apparatus according to claim 1, wherein the first and second beams are light beams having different wavelengths.

11. A dry etching apparatus according to claim 1, wherein the first feedstock gas is a halogen or a halogen containing gas.

12. A dry etching apparatus according to claim 1, wherein the second feedstock gas is a hydrogen gas, oxygen gas, or a gas containing at least one of halogen, hydrogen, oxygen, and carbon.

13. A dry etching apparatus according to claim 1, wherein the second feedstock gas consists of a hydrocarbon or carbonyl compound.

14. A dry etching apparatus according to claim 1, wherein the second feedstock gas is used to form a thin film on the etched side wall of the workpiece, the thin film protecting it against lateral etching.

15. A dry etching apparatus according to claim 1, wherein the apparatus further comprises a means for heating the workpiece.

16. A dry etching apparatus according to claim 1, wherein the first and second feedstock gases are mixed and then introduced into the container.

17. A dry etching apparatus according to claim 1, wherein an etching mask is provided on the workpiece to permit an etching of selected portions of the workpiece.

18. A dry etching apparatus according to claim 1, wherein a mask is disposed between the workpiece and the first beam generating means so that the first beam impinges on selected portions of the workpiece.

19. A method of dry etching and producing a substantially anisotropically etched workpiece positioned within an evacuated container comprising the steps of:
supplying a first feedstock gas for use in etching said workpiece;
generating and directing a first beam toward the workpiece for exciting said first feedstock gas to etch selected portions of the workpiece;
supplying a second feedstock gas for use in substantially limiting lateral etching of the workpiece; and
generating and directing a second beam in the general direction of the workpiece for exciting said second feedstock gas to substantially limit lateral etching of the workpiece.

20. A method of dry etching as claimed in claim 19, wherein at least one of the first and second beam generating means is a light source.

21. A method of dry etching as claimed in claim 19, further comprising the steps of:
directing the first bean to impinge the workpiece in a direction substantially perpendicular to the etching surface of the workpiece; and
directing the second beam toward the workpiece in a direction substantially parallel to the etching surface.

22. A method of dry etching as claimed in claim 19, further comprising the step of:
scanning at least one of said beams over the workpiece.

23. A method of dry etching as claimed in claim 19, further comprising the step of:
reciprocating the workpiece so that at least one of said beams is scanned over the workpiece.

24. A method of dry etching as claimed in claim 19, wherein the second feedstock gas is a hydrogen gas, oxygen gas, or gas containing at least one of halogen, hydrogen, oxygen and carbon.

25. A method of dry etching as claimed in claim 19, wherein the second feedstock gas consists of a hydrocarbon or carbonyl compound.

26. A method of dry etching as claimed in claim 19, further comprising the step of heating the workpiece.

27. A method of dry etching as claimed in claim 19, further comprising the step of positioning a mask between the workpiece and the first beam generating means so that the first beam impinges on selected portions of the workpiece.

28. A dry etching apparatus for producing a substantially anisotropically etched workpiece comprising:
a container in which said workpiece is placed,
an evacuating means for evacuating the container,
a gas supply means for providing a feedstock gas for use in etching and substantially limiting lateral etching of the workpiece,
a first beam generating means for generating and directing a first beam toward the workpiece for exciting the surface of the workpiece to etch selected portions of said workpiece, and,
second beam generating means for generating and directing a second beam in the general direction of the workpiece for dissociating the gas into reactive radicals for both etching and substantially limiting lateral etching of the workpiece.

29. A dry etching apparatus according to claim 28, wherein at least one of the first and second beam generating means is a light source.

30. A dry etching apparatus according to claim 29, wherein said beam generating means emits a laser beam.

31. A dry etching apparatus according to claim 28, wherein the first beam impinges the workpiece in a direction substantially perpendicular to the etching surface of the workpiece, and wherein the second beam is directed toward the workpiece in a direction substantially parallel to the etching surface.

32. A dry etching apparatus of claim 28, wherein the second beam dissociates the gas into a first and second radical, the first radical contributing to the etching, while side etching is prevented by the recombination of the first and second radicals.

33. A method of dry etching and producing a substantially anisotropically etched workpiece positioned within an evacuated container comprising the steps of:
supplying a feedstock gas for use in etching and substantially limiting lateral etching of the workpiece
generating and directing a first beam toward the workpiece for exciting the surface of the workpiece to etch selected portions of the workpiece; and,
generating and directing a second beam in the general direction of the workpiece for dissociating the gas into reactive radicals for both etching and substantially limiting lateral etching of the workpiece.

34. A method of dry etching as claimed in claim 33, wherein at least one of the first and second beam generating means is a light source.

35. A method of dry etching as claimed in claim 33, further comprising the steps of:
directing the first beam to impinge the workpiece in a direction substantially perpendicular to the etching surface of the workpiece; and
directing the second beam toward the workpiece in a direction substantially parallel to the etching surface.

36. A method of dry etching a claimed in claim 33 wherein the second beam dissociates the gas into first and second radicals, the first radical contributing to the etching, while side etching is prevented by the recombination of the first and second radicals.

* * * * *